United States Patent
Saito

(10) Patent No.: US 7,884,395 B2
(45) Date of Patent: Feb. 8, 2011

(54) SEMICONDUCTOR APPARATUS

(75) Inventor: Wataru Saito, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1 day.

(21) Appl. No.: 12/145,980

(22) Filed: Jun. 25, 2008

(65) Prior Publication Data

US 2009/0008679 A1    Jan. 8, 2009

(30) Foreign Application Priority Data

Jun. 26, 2007   (JP) .............................. 2007-167427

(51) Int. Cl.
*H01L 29/66* (2006.01)

(52) U.S. Cl. .............................. 257/199; 257/E29.335; 257/194; 257/80; 438/380

(58) Field of Classification Search ................ 257/106, 257/49, 199, 98; 438/33, 207
See application file for complete search history.

(56) References Cited

U.S. PATENT DOCUMENTS

| | | | |
|---|---|---|---|
| 4,200,877 A * | 4/1980 | Suzuki et al. .................. | 257/49 |
| 7,199,408 B2 * | 4/2007 | Miyoshi ..................... | 257/194 |
| 7,250,641 B2 | 7/2007 | Saito et al. | |
| 7,271,429 B2 | 9/2007 | Saito et al. | |
| 7,329,909 B2 | 2/2008 | Saito et al. | |
| 2004/0124500 A1 * | 7/2004 | Kawagoe ..................... | 257/548 |
| 2005/0062069 A1 | 3/2005 | Saito et al. | |
| 2005/0189559 A1 * | 9/2005 | Saito et al. .................. | 257/189 |
| 2007/0051977 A1 | 3/2007 | Saito et al. | |
| 2007/0170463 A1 * | 7/2007 | Ueno et al. .................. | 257/192 |
| 2007/0200143 A1 | 8/2007 | Saito et al. | |

FOREIGN PATENT DOCUMENTS

| | | |
|---|---|---|
| JP | 2001-168111 | 6/2001 |
| JP | 2003-229566 | 8/2003 |
| JP | 2007-59589 | 3/2007 |
| JP | 2009-4398 | 1/2009 |

* cited by examiner

*Primary Examiner*—Thanh V Pham
*Assistant Examiner*—Mark A Laurenzi, III
(74) *Attorney, Agent, or Firm*—Oblon, Spivak, McClelland, Maier & Neustadt, L.L.P.

(57) ABSTRACT

A semiconductor apparatus includes, a first silicon layer of a first conductivity type; a second silicon layer provided on the first silicon layer and having a higher resistance than the first silicon layer, a third silicon layer of a second conductivity type provided on the second silicon layer, a first nitride semiconductor layer provided on the third silicon layer, a second nitride semiconductor layer provided on the first nitride semiconductor layer and having a larger bandgap than the first nitride semiconductor layer, a first main electrode being in contact with a surface of the second nitride semiconductor layer and connected to the third silicon layer, a second main electrode being in contact with the surface of the second nitride semiconductor layer and connected to the first silicon layer, and a control electrode provided between the first main electrode and the second main electrode on the second nitride semiconductor layer.

17 Claims, 6 Drawing Sheets

SEMICONDUCTOR APPARATUS

CROSS-REFERENCE TO RELATED APPLICATIONS

This application is based upon and claims the benefit of priority from the prior Japanese Patent Application No. 2007-167427, filed on Jun. 26, 2007; the entire contents of which are incorporated herein by reference.

BACKGROUND OF THE INVENTION

1. Field of the Invention

This invention relates to a semiconductor apparatus, and more particularly to a semiconductor apparatus based on a heterojunction structure of a nitride semiconductor.

2. Background Art

A nitride semiconductor device based on GaN has a larger bandgap than Si and a higher critical electric field. Hence, a small device with high breakdown voltage is realized more easily. The GaN-based semiconductor device used as a power semiconductor device has low on-resistance, realizing a low-loss device. Among others, a field effect transistor based on AlGaN/GaN heterojunction structure (see, e.g., JP-A 2007-059589 (Kokai)) has a simple device structure, showing promise for good characteristics.

Power devices based on wide bandgap semiconductors are currently under active research. However, while GaN and other nitride semiconductor devices achieve low on-resistance, characteristics specific to power devices such as avalanche capability are not taken into consideration in their design. This is because GaN-based devices are designed primarily for communication devices.

SUMMARY OF THE INVENTION

According to an aspect of the invention, there is provided a semiconductor apparatus including: a first silicon layer of a first conductivity type; a second silicon layer provided on the first silicon layer and having a higher resistance than the first silicon layer; a third silicon layer of a second conductivity type provided on the second silicon layer; a first nitride semiconductor layer provided on the third silicon layer; a second nitride semiconductor layer provided on the first nitride semiconductor layer and having a larger bandgap than the first nitride semiconductor layer; a first main electrode being in contact with a surface of the second nitride semiconductor layer and connected to the third silicon layer; a second main electrode being in contact with the surface of the second nitride semiconductor layer and connected to the first silicon layer; and a control electrode provided between the first main electrode and the second main electrode on the second nitride semiconductor layer.

DETAILED DESCRIPTION OF THE INVENTION

Figure 1:
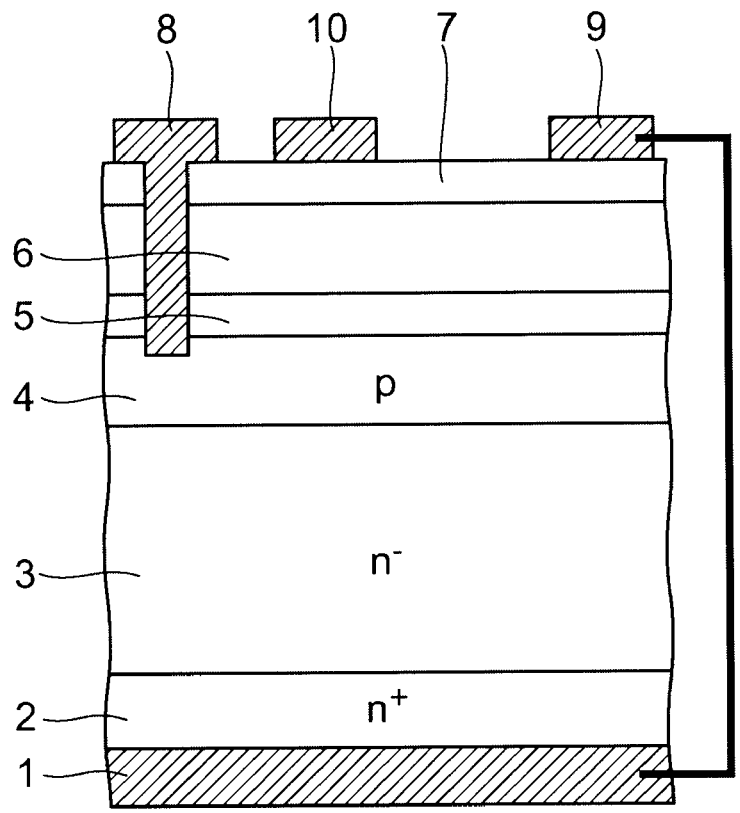
FIG. 1 is a schematic view showing the principal cross-sectional structure of a semiconductor apparatus according to a first embodiment of the invention.

Embodiments of the invention will now be described with reference to the drawings. In the present embodiments, a heterojunction field effect transistor (HFET) based on a heterojunction structure of a nitride semiconductor is taken as an example semiconductor apparatus. In the following embodiments, it is assumed that the first conductivity type and the second conductivity type are n-type and p-type, respectively. Like elements in the drawings are labeled with like reference numerals.

First Embodiment

FIG. 1 is a schematic view showing the principal cross-sectional structure of a semiconductor apparatus according to a first embodiment of the invention.

On the major surface of a highly doped $n^+$-type silicon layer (or silicon substrate) 2 serving as a first silicon layer, an $n^-$-type silicon layer 3 is provided as a second silicon layer. A p-type silicon layer 4 is provided as a third silicon layer on the major surface of the $n^-$-type silicon layer 3. The $n^-$-type silicon layer 3 has a lower impurity concentration and a higher resistance than the $n^+$-type silicon layer 2 and the p-type silicon layer 4.

A heterojunction structure of a channel layer 6 serving as a first nitride semiconductor layer and a barrier layer 7 serving as a second nitride semiconductor layer, which has a larger bandgap than the channel layer 6, is provided via a buffer layer 5 on the major surface of the p-type silicon layer 4.

For example, the channel layer 6 is made of undoped GaN, and the barrier layer 7 is made of undoped or n-type AlGaN. The buffer layer 5, the channel layer 6, and the barrier layer 7 are epitaxially grown in this order on the major surface of the p-type silicon layer 4. The buffer layer 5 illustratively made of undoped AlGaN is provided between the p-type silicon layer 4 and the channel layer 6 so that GaN can be grown with good crystallinity on the silicon surface.

A source electrode 8 serving as a first main electrode, a drain electrode 9 serving as a second main electrode, and a gate electrode 10 serving as a control electrode are provided on the surface of the barrier layer 7. These electrodes are spaced and insulated from each other. The gate electrode 10 is disposed between the source electrode 8 and the drain electrode 9.

The gate electrode 10 is in Schottky contact with the surface of the barrier layer 7. By controlling the gate voltage applied to the gate electrode 10, two-dimensional electron gas concentration at the underlying heterojunction interface between the barrier layer 7 and the channel layer 6 is increased or decreased, and the main current flowing between the source electrode 8 and the drain electrode 9 is varied.

The laminated structure of the n⁻-type silicon layer 3 sandwiched between the n⁺-type silicon layer and the p-type silicon layer 4 constitutes a silicon pin diode, on which a gallium nitride-based HFET is provided. That is, the HFET and the silicon pin diode connected in parallel between the source and drain thereof are integrated on a common substrate (chip).

The source electrode 8 is in ohmic contact with the surface of the barrier layer 7, and also connected to the p-type silicon layer 4 through an underlying trench that penetrates the barrier layer 7, the channel layer 6, and the buffer layer 5 and reaches the p-type silicon layer 4. Thus, the source electrode 8 also serves as an anode electrode of the silicon pin diode.

The drain electrode 9 is in ohmic contact with the surface of the barrier layer 7, and also connected to the n⁺-type silicon layer 2 through a backside electrode 1, which is provided on the backside (the surface on the opposite side of the major surface) of the n⁺-type silicon layer 2 and serves as a cathode electrode of the silicon pin diode, and through an interconnect connecting the drain electrode 9 to the backside electrode 1.

Conventionally, an HFET based on the AlGaN/GaN heterojunction structure has difficulty in achieving high avalanche capability because holes are not rapidly ejected at the time of avalanche breakdown. When a high voltage is applied to the drain electrode of this HFET, the electric field between the gate electrode and the drain electrode increases. Hence, avalanche breakdown is likely to occur at the end of the gate electrode or the end of the drain electrode. Electrons and holes produced by avalanche breakdown flow toward the drain electrode and gate electrode, respectively. However, the barrier layer of AlGaN exists between the gate electrode and the channel layer of GaN. Because of the band discontinuity between GaN and AlGaN valence band, holes are not rapidly ejected to the gate electrode, but accumulated in the channel layer. The accumulated holes further enhance the electric field and increase the avalanche current, ultimately leading to device breakdown.

In contrast, in this embodiment, the HFET described above is formed on and integrated with a silicon pin diode to provide a structure in which the silicon pin diode is connected in parallel between the source and drain of the HFET, and an avalanche current is passed through the silicon pin diode. Thus, high avalanche capability can be achieved, and a reliable semiconductor apparatus resistant to device breakdown can be realized.

The breakdown voltage of the silicon pin diode is designed to be lower than the breakdown voltage between the gate electrode 10 and the drain electrode 9 of the HFET. Thus, upon application of high voltage to the drain electrode 9, avalanche breakdown occurs earlier on the silicon pin diode side, preventing the electric field between the gate electrode 10 and the drain electrode 9 from becoming high enough to cause avalanche breakdown in the HFET. That is, when a high voltage is applied to the drain electrode 9 and reaches the breakdown voltage of the silicon pin diode, avalanche breakdown occurs in the silicon pin diode, and an avalanche current flows therethrough. At this time, the HFET does not reach its breakdown voltage, and hence avalanche breakdown does not occur at the heterojunction interface between the barrier layer 7 and the channel layer 6. Electrons and holes produced by the avalanche breakdown in the silicon pin diode are rapidly ejected to the n⁺-type silicon layer 2 and the p-type silicon layer 4, respectively. Thus, the silicon pin diode has high avalanche capability.

In FIG. 1, a trench extending from the surface of the barrier layer 7 to the p-type silicon layer 4 is formed and filled with a source electrode 8. Thus, the source electrode 8 of the HFET is connected to the p-type silicon layer 4 of the pin diode. That is, an electrode, which simultaneously serves as the source electrode of the HFET and the anode electrode of the pin diode, is integrally formed.

Figure 2:
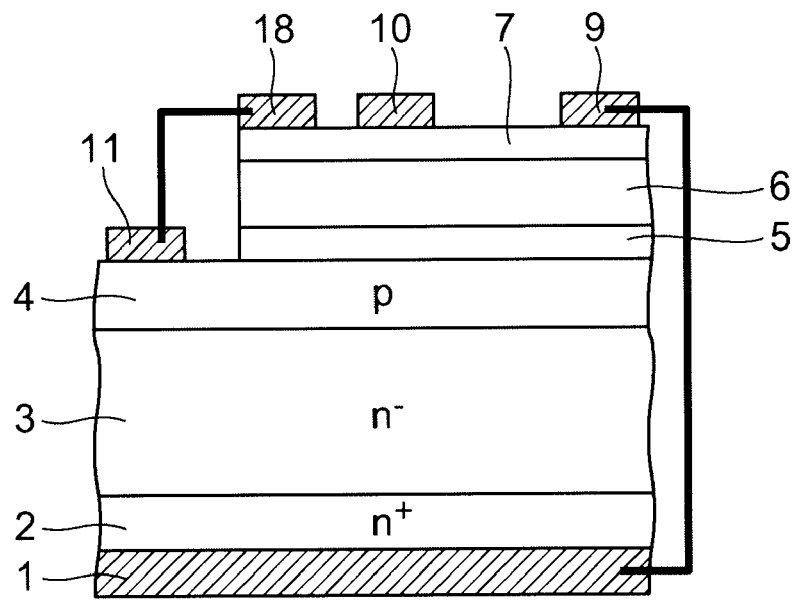
FIG. 2 is a schematic cross-sectional view showing another example of the semiconductor apparatus according to the first embodiment.

However, this embodiment is not limited thereto. As shown in FIG. 2, an anode electrode 11 of the pin diode can be provided independent of the source electrode 18 of the HFET provided on the surface of the barrier layer 7. The anode electrode 11 is provided on the surface of the p-type silicon layer 4 in ohmic contact with its portion outside the buffer layer 5, the channel layer 6, and the barrier layer 7, and connected to the source electrode 18 via an interconnect.

In the following, other embodiments of the invention are described. The same elements as those in the above embodiment are labeled with like reference numerals, and the detailed description thereof is omitted.

Second Embodiment

Figure 3A:
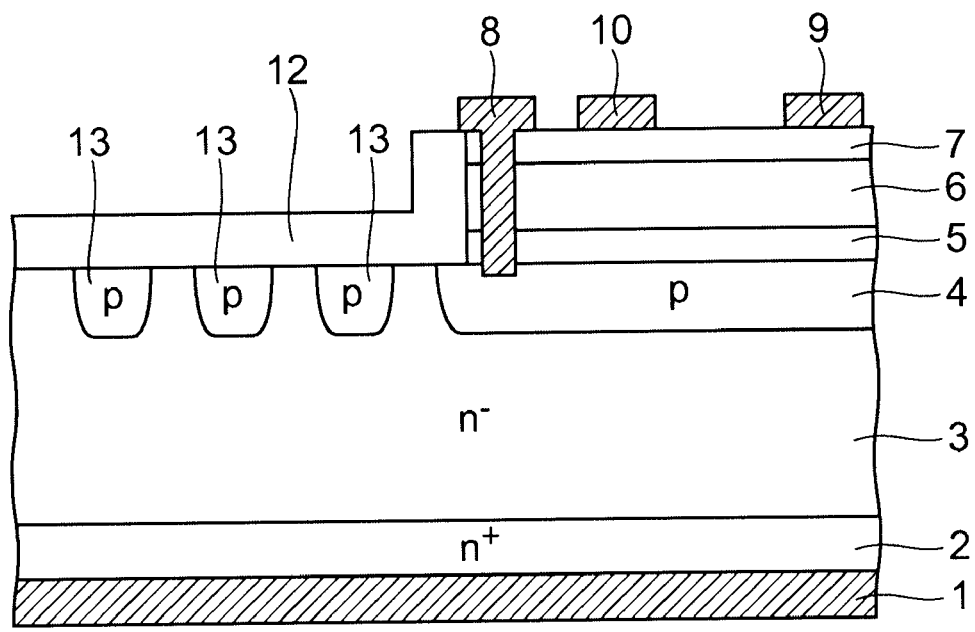
FIG. 3A is a schematic view showing the principal cross-sectional structure of a semiconductor apparatus according to a second embodiment of the invention.

FIG. 3A is a schematic view showing the principal cross-sectional structure of a semiconductor apparatus according to a second embodiment of the invention.

In this embodiment, one or more (in the example shown, three) p-type guard ring layers 13 are selectively provided as fourth silicon layers in the surface of the n⁻-type silicon layer 3 in the termination section, which is located on the outer periphery side of the device section including the pin diode and the overlying HFET. The surface of the termination section including the guard ring layers 13 is covered with a field insulating film 12.

Thus, even if a depletion layer extends from the p-type silicon layer 4 of the device section toward the termination section, the guard ring layer 13 prevents electric field concentration at the end of the p-type silicon layer 4, achieving stable breakdown voltage. Furthermore, prevention of electric field concentration at the end of the p-type silicon layer 4 allows an avalanche current to flow through the pin diode not only at the end of the p-type silicon layer 4 but also throughout the p-type silicon layer 4, which facilitates achieving higher avalanche capability.

Figure 3B:
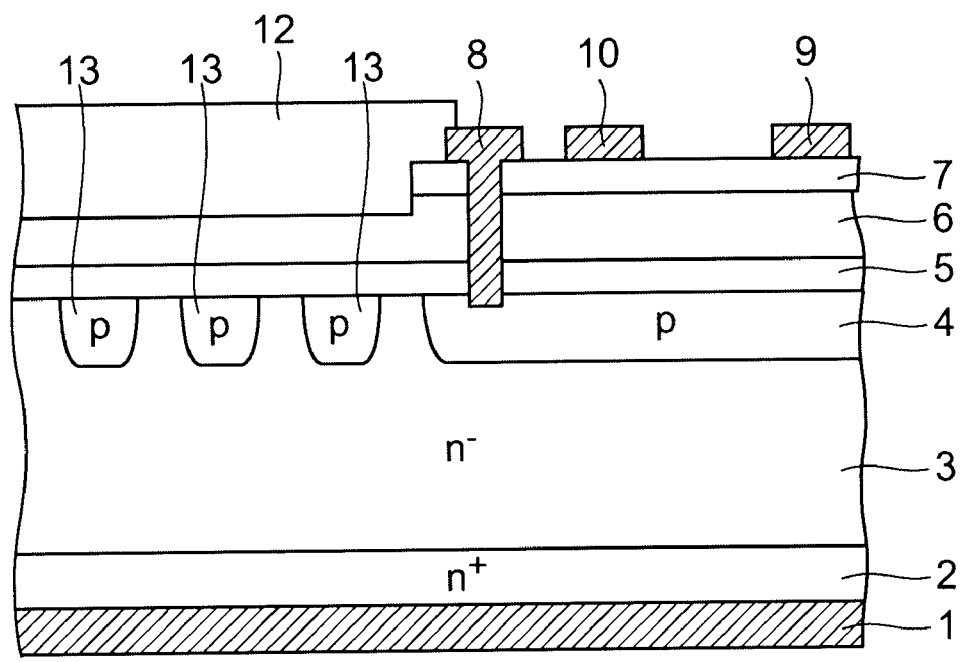
FIG. 3B is a schematic view showing the principal cross-sectional structure of another example of the semiconductor apparatus according to the second embodiment of the invention.

FIG. 3B is a schematic view showing the principal cross-sectional structure of another example of the semiconductor apparatus according to the second embodiment of the invention.

In this example, the buffer layer 5 and the channel layer 6 are formed on the p-type guard ring layers 13 which are selectively provided in the termination section which is located on the outer periphery side of the device section including the pin diode and the overlying HFET.

This structure can be formed by selectively removing the barrier layer 7 in the termination section by etching after performing a crystal growth of the buffer layer 5, channel layer 6 and the barrier layer 7. The fabrication of this example is easier compared to the example described with reference to FIG. 3A where all of the crystal grown layers are removed by etching in the termination section.

According to the example shown in FIG. 3B, two-dimensional electron gas is not generated in the termination section as the barrier layer 7 is removed therefrom. As a result, generation of leakage current is suppressed even when a high voltage is applied. Further, breakdown electrical field strength can be increased almost as high as a insulating film, by forming the buffer layer 5 and the channel layer 6 made of a nitride semiconductor on the silicon layer 3 where the guard ring layers 13 are formed. Further, the interface on the silicon layer 3 is stabilized by forming the buffer layer 5 and the channel layer 6 made of a nitride semiconductor by a crystal growth. As a result, the surface of the silicon layer 3 is stabilized and is resistant to degraded, and thus a stabilized breakdown voltage and a high reliability can be realized as in the case where the field insulating film 12 is formed on the surface of the silicon layer 3.

Third Embodiment

Figure 4:
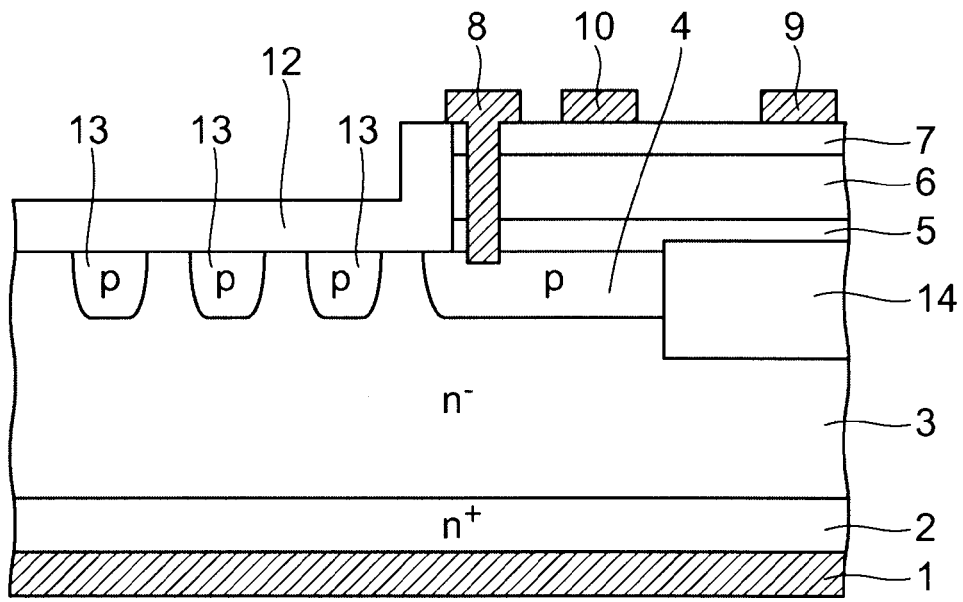
FIG. 4 is a schematic view showing the principal cross-sectional structure of a semiconductor apparatus according to a third embodiment of the invention.

FIG. 4 is a schematic view showing the principal cross-sectional structure of a semiconductor apparatus according to a third embodiment of the invention.

In this embodiment, an insulator 14 such as silicon oxide and silicon nitride is provided between the channel layer 6 and the n⁻-type silicon layer 3 below the drain electrode 9. In this structure, when a high voltage is applied to the drain electrode 9, the voltage is also applied to the insulator 14. Thus, the voltage is held by both the channel layer 6 and the insulator 14. Hence, the channel layer 6 does not need to be so thickened for the purpose of ensuring adequate breakdown voltage. Because the channel layer 6 can be thinned, a crack-free AlGaN/GaN heterojunction structure of the barrier layer 7 and the channel layer 6 can be easily formed, and the substrate warpage can be also reduced.

The structure shown in FIG. 4 can be realized by forming a groove extending from the surface of the p-type silicon layer 4 to the n⁻-type silicon layer 3, filling the groove with an insulator 14, and then forming an AlGaN/GaN heterojunction structure by selective growth.

Fourth Embodiment

Figure 5:
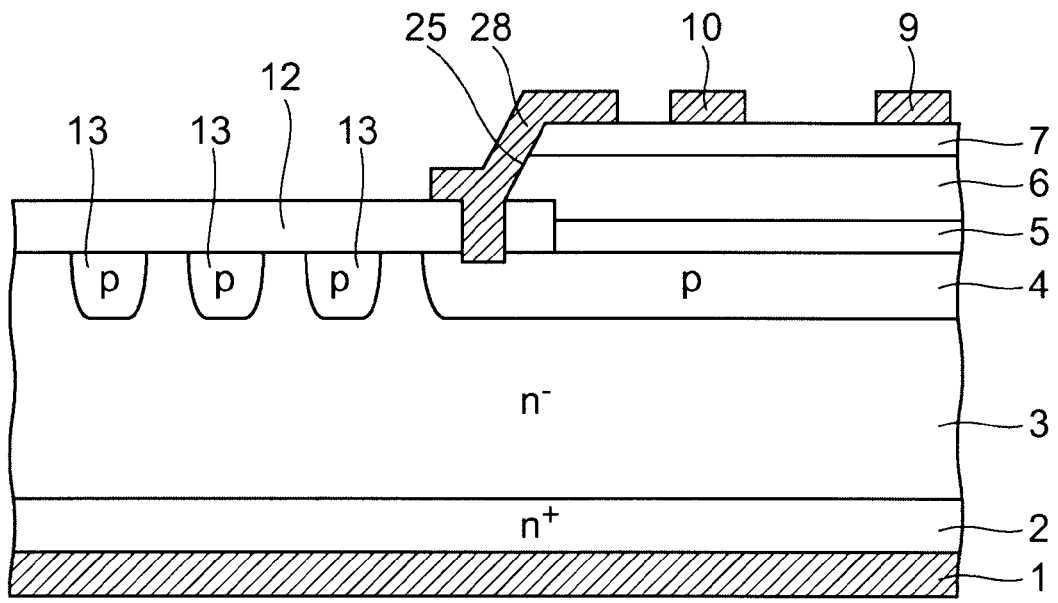
FIG. 5 is a schematic view showing the principal cross-sectional structure of a semiconductor apparatus according to a fourth embodiment of the invention.

FIG. 5 is a schematic view showing the principal cross-sectional structure of a semiconductor apparatus according to a fourth embodiment of the invention.

In this embodiment, the field insulating film 12 is used as a mask to form a buffer layer 6, a channel layer 6, and a barrier layer 7 by selective epitaxial growth on the exposed surface of the p-type silicon layer 4.

Thus, the AlGaN/GaN heterojunction structure of the barrier layer 7 and the channel layer 6 is crystal grown like an island on the p-type silicon layer 4. This allows the channel layer 6 to be thickened with good crystallinity as compared with the case of film-like crystal growth, and the breakdown voltage of the HFET can be increased.

The source electrode 28 starts from the surface of the barrier layer 7, passes through the facet 25 formed by selective island growth of the AlGaN/GaN heterojunction structure of the barrier layer 7 and the channel layer 6, and extends onto the surface of the field insulating film 12 located at the level lower than the surface of the barrier layer 7. That is, the source electrode 28 is integrally formed to cover the stepped portion formed from the surface of the barrier layer 7, the facet 25, and the surface of the field insulating film 12. Furthermore, the source electrode 28 is connected to the p-type silicon layer 4 through a trench, which penetrates the field insulating film 12 below the source electrode 28 to the p-type silicon layer 4. The structure of this embodiment allows integral formation of a source electrode 28 connected to both the barrier layer 7 and the p-type silicon layer 4 without forming a trench that starts from the surface of the barrier layer 7, penetrates the underlying channel layer 6 and the buffer layer 5, and reaches the p-type silicon layer 4.

Furthermore, because the p-type silicon layer 4 is connected to the source electrode 28, no voltage is applied to the sidewall (facet 25) of the AlGaN/GaN heterojunction structure of the barrier layer 7 and the channel layer 6 formed by island growth. Thus, leakage current can be avoided.

Figure 6:
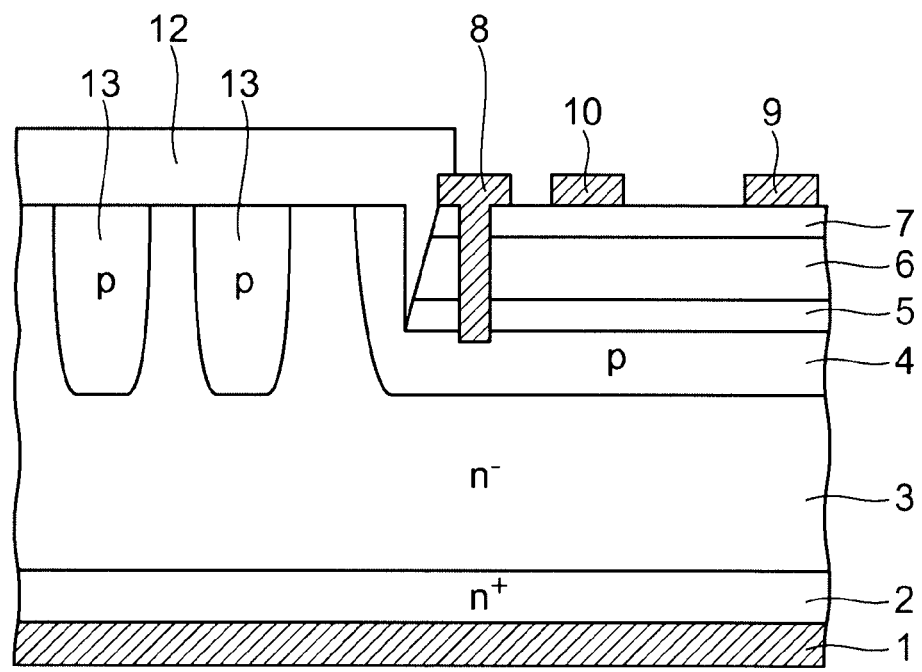
FIG. 6 is a schematic cross-sectional view showing another example of the semiconductor apparatus according to the fourth embodiment.

Furthermore, as shown in FIG. 6, after a trench is formed in the p-type silicon layer 4, a buffer layer 5, a channel layer 6, and a barrier layer 7 can be formed on the surface of the p-type silicon layer 4 at the bottom of the trench by selective epitaxial growth to prevent these growth layers from protruding outside the trench. This reduces irregularities on the device surface, facilitating the process for electrode formation.

The embodiments of the invention have been described with reference to the examples. However, the invention is not limited thereto, but can be variously modified within the spirit of the invention.

Figure 7:
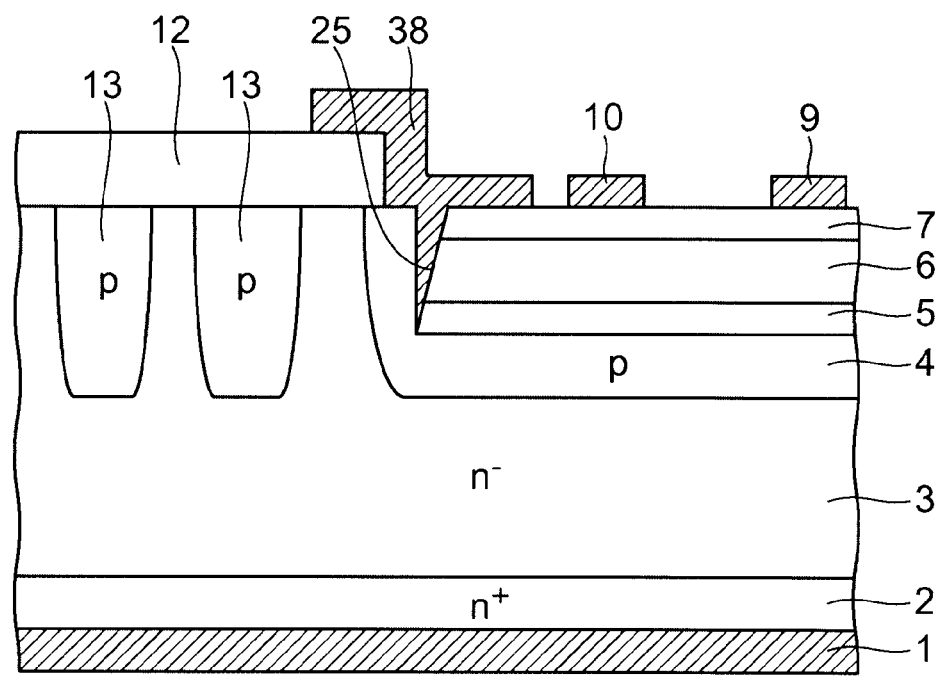
FIG. 7 is a schematic cross-sectional view showing a variation of the semiconductor apparatus according to the embodiment of the invention.

In the structure shown in FIG. 6, a trench extending from the surface of the barrier layer 7 to the p-type silicon layer 4 is formed to extract a source electrode 8. Alternatively, as shown in FIG. 7, the gap between the sidewall of the groove formed in the p-type silicon layer 4 and the nitride semiconductor layers (buffer layer 5, channel layer 6, and barrier layer 7) can be filled with a source electrode 38. By forming the source electrode 38 as shown in FIG. 7, the nitride semiconductor layers can be electrically connected to the source electrode 38 at the facet 25 of the nitride semiconductor layers and the surface of the barrier layer 7 as in FIG. 5, and the p-type silicon layer 4 can be connected to the source electrode 38 at the sidewall of the trench formed in the p-type silicon layer 4. Thus, the same effect as in the structure of FIG. 6 is achieved. Furthermore, there is no need to etch the nitride semiconductor layers to extract the source electrode 38, facilitating the process.

In the above embodiments, the heterojunction structure of the barrier layer 7 and the channel layer 6 is described with reference to the combination of AlGaN/GaN. However, the present embodiments are also practicable using combinations such as GaN/InGaN, AlN/AlGaN, and AlN/GaN.

The buffer layer 5 is not limited to undoped AlGaN, but can be made of n-type AlGaN. Alternatively, other nitride semiconductors such as a laminated structure of AlN/GaN can be used as a buffer layer.

Figure 8:
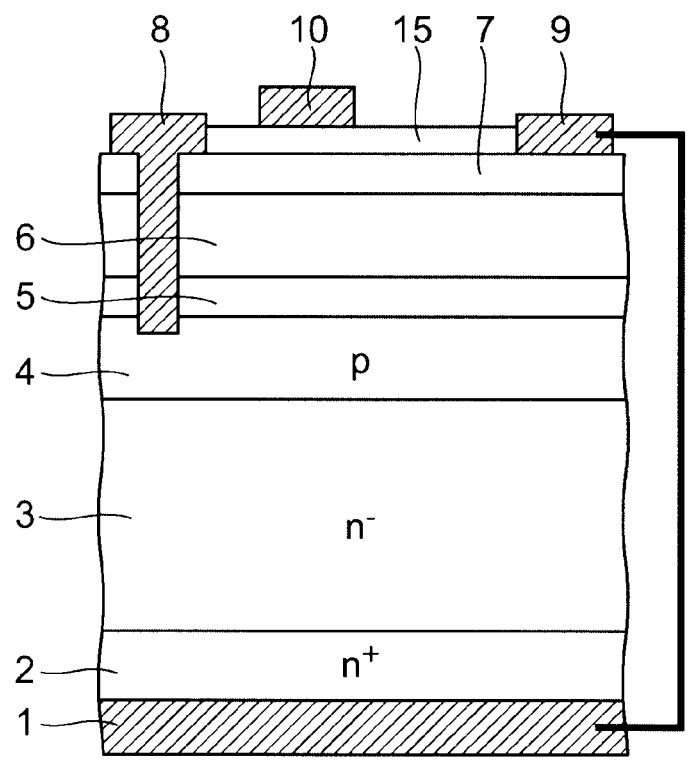
FIG. 8 is a schematic cross-sectional view showing another variation of the semiconductor apparatus according to the embodiment of the invention.

The gate structure of the HFET is described as a gate structure based on the Schottky junction. However, as shown in FIG. 8, the present embodiments are also practicable using an insulated gate structure in which a gate insulating film 15 is provided between the barrier layer 7 and the gate electrode 10.

Figure 9:
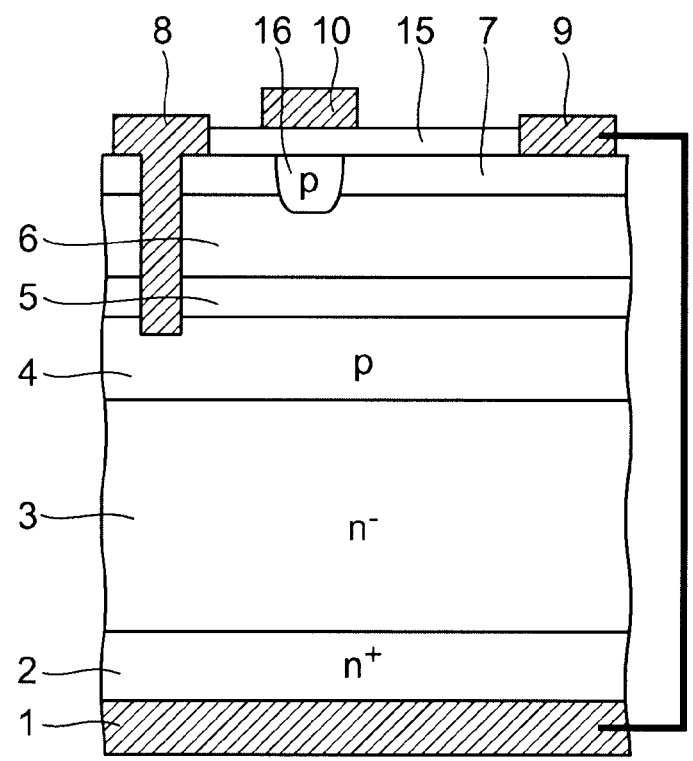
FIG. 9 is a schematic cross-sectional view showing still another variation of the semiconductor apparatus according to the embodiment of the invention.

The gallium nitride-based HFET is typically implemented as a normally-on device having a negative gate threshold voltage. However, as shown in FIG. 9, a p-type layer 16 can be provided in the heterojunction structure of the barrier layer 7 and the channel layer 6 below the gate electrode 10 to eliminate two-dimensional electron gas below the gate electrode 10 in the off-state, thereby realizing a normally-off device.

Furthermore, the normally-off operation can be also realized by using other structures to shift the threshold voltage to the positive side, such as a structure in which a p-type GaN layer is crystal grown as a channel layer, or a recessed gate structure.

Figure 10:
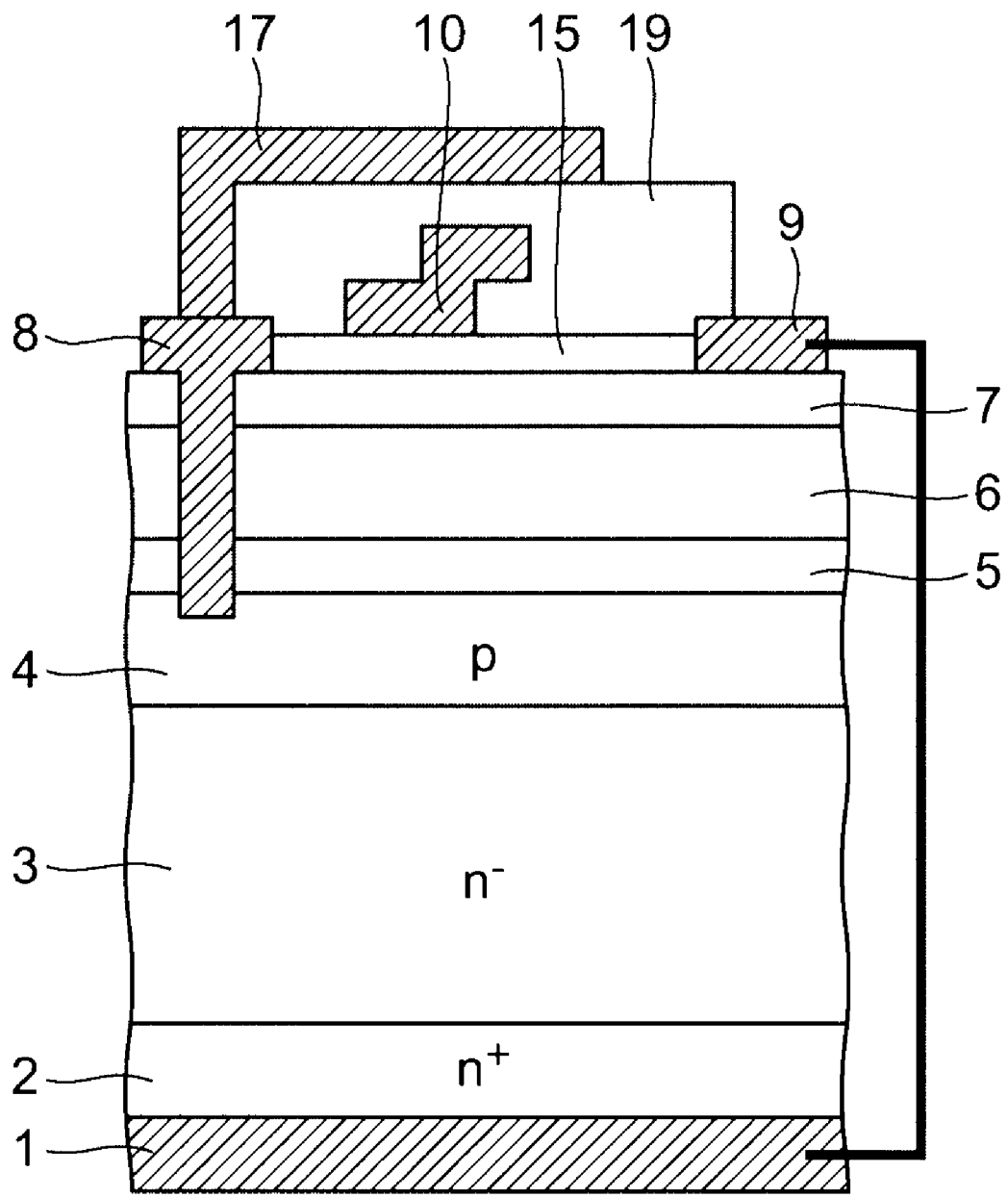
FIG. 10 is a schematic cross-sectional view showing still another variation of the semiconductor apparatus according to the embodiment of the invention.

To further increase the breakdown voltage of the HFET, as shown in FIG. 10, it is also practicable to use a field plate structure in which a field plate electrode 17 connected to the source electrode 8 is provided via a field insulating film 19.

The gate-drain structure of the HFET is similar to a heterojunction Schottky barrier diode (HSBD). Hence, the structure according to the embodiments of the invention can be used to realize an HSBD with high breakdown voltage.

The second silicon layer 3 is not limited to having a fixed impurity concentration. The concentration can be varied so that it is high near the first silicon layer 2, and low near the third silicon layer 4. The concentration can be varied either gradually or stepwise.

The invention claimed is:

1. A semiconductor apparatus comprising:
    a first silicon layer of a first conductivity type;
    a second silicon layer provided on the first silicon layer and having a higher resistance than the first silicon layer;
    a third silicon layer of a second conductivity type provided on the second silicon layer;
    a first nitride semiconductor layer provided on the third silicon layer;
    a second nitride semiconductor layer provided on the first nitride semiconductor layer and having a larger bandgap than the first nitride semiconductor layer;
    a first main electrode being in contact with a surface of the second nitride semiconductor layer and the third silicon layer;
    a second main electrode being in contact with the surface of the second nitride semiconductor layer and connected to the first silicon layer; and
    a control electrode provided between the first main electrode and the second main electrode on the second nitride semiconductor layer,
    a diode including the first silicon layer, the second silicon layer, and the third silicon layer being connected in parallel between the first main electrode and the second main electrode of a transistor including the first nitride semiconductor layer, the second nitride semiconductor layer, the first main electrode, the second main electrode, and the control electrode,
    a breakdown voltage of the diode being lower than a breakdown voltage of the transistor between the second main electrode and the control electrode.

2. The semiconductor apparatus according to claim 1, further comprising:
    a buffer layer provided between the third silicon layer and the first nitride semiconductor layer.

3. The semiconductor apparatus according to claim 2, wherein the buffer layer includes a nitride semiconductor.

4. The semiconductor apparatus according to claim 3, wherein the buffer layer includes AlGaN.

5. The semiconductor apparatus according to claim 1, wherein the first main electrode is connected to the third silicon layer through a trench penetrating the second nitride semiconductor layer and the first nitride semiconductor layer and reaching the third silicon layer.

6. The semiconductor apparatus according to claim 1, further comprising a backside electrode provided on a backside of the first silicon layer, the backside electrode being connected to the second main electrode.

7. The semiconductor apparatus according to claim 1, wherein two-dimensional electron gas concentration at a heterojunction interface between the second nitride semiconductor layer and the first nitride semiconductor layer is varied by controlling a control voltage applied to the control electrode.

8. The semiconductor apparatus according to claim 1, further comprising:
    one or more fourth silicon layers of the second conductivity type selectively provided in a surface of the second silicon layer in a termination section on the outer periphery side of a device section including the first nitride semiconductor layer and the second nitride semiconductor layer.

9. The semiconductor apparatus according to claim 8, wherein a surface of the termination section including the fourth silicon layer is covered with a field insulating film.

10. The semiconductor apparatus according to claim 1, further comprising:
    an insulator provided between the first nitride semiconductor layer and the second silicon layer below the second main electrode.

11. The semiconductor apparatus according to claim 10, wherein the insulator is one of silicon oxide and silicon nitride.

12. The semiconductor apparatus according to claim 1, wherein the first nitride semiconductor layer and the second nitride semiconductor layer are provided in an island configuration on the third silicon layer.

13. The semiconductor apparatus according to claim 1, wherein the first nitride semiconductor layer and the second nitride semiconductor layer are provided in a trench formed in the third silicon layer.

14. The semiconductor apparatus according to claim 1, wherein the first nitride semiconductor layer is a GaN layer, and the second nitride semiconductor layer is an AlGaN layer.

15. The semiconductor apparatus according to claim 1, wherein the first nitride semiconductor layer is an InGaN layer, and the second nitride semiconductor layer is a GaN layer.

16. The semiconductor apparatus according to claim 1, wherein the first nitride semiconductor layer is an AlGaN layer, and the second nitride semiconductor layer is an AlN layer.

17. The semiconductor apparatus according to claim 8, wherein a surface of the termination section including the fourth silicon layer is covered with a nitride semiconductor layer.

* * * * *